United States Patent [19]

Terasawa

[11] 3,943,548

[45] Mar. 9, 1976

[54] SEMICONDUCTOR CONTROLLED RECTIFIER

[75] Inventor: Yoshio Terasawa, Hitachi, Japan

[73] Assignee: Hitachi, Ltd., Japan

[22] Filed: Feb. 5, 1974

[21] Appl. No.: 439,698

[30] Foreign Application Priority Data
Feb. 14, 1973 Japan................................ 48-17478

[52] U.S. Cl....................... 357/38; 357/20; 357/55; 357/86
[51] Int. Cl.²......................................... H01L 29/74
[58] Field of Search.............. 357/20, 38, 39, 55, 86

[56] References Cited
UNITED STATES PATENTS

| | | | |
|---|---|---|---|
| 3,356,862 | 12/1967 | Diebold et al. | 357/38 |
| 3,409,811 | 11/1968 | Gerlach | 357/38 |
| 3,476,989 | 11/1969 | Miles et al. | 357/38 |
| 3,611,066 | 10/1971 | Knaus | 357/38 |
| 3,611,072 | 10/1971 | Hamilton | 357/38 |
| 3,629,667 | 12/1971 | Lubart et al. | 357/38 |
| 3,671,821 | 6/1972 | Nakata et al. | 357/38 |
| 3,731,162 | 5/1973 | Suenaga et al. | 357/38 |
| 3,794,890 | 2/1974 | Weimann et al. | 357/38 |
| 3,836,994 | 9/1974 | Piccone et al. | 357/38 |

*Primary Examiner*—Andrew J. James
*Assistant Examiner*—Joseph E. Clawson, Jr.
*Attorney, Agent, or Firm*—Craig & Antonelli

[57] ABSTRACT

A semiconductor controlled rectifier comprising a four-layer semicondcutor substrate of *pnpn* structure, a pair of main electrodes in contact with the outer p-type and n-type layers respectively, and a gate electrode in contact with one of the intermediate layers forming a *pn* junction between it and the outer layer adjacent thereto, wherein gate current supplied from the gate electrode flows into the outer layer adjacent to the intermediate layer having the gate electrode thereon across a portion of the *pn* junction which portion is parallel with the surface of the said outer layer in contact with the main electrode.

8 Claims, 15 Drawing Figures

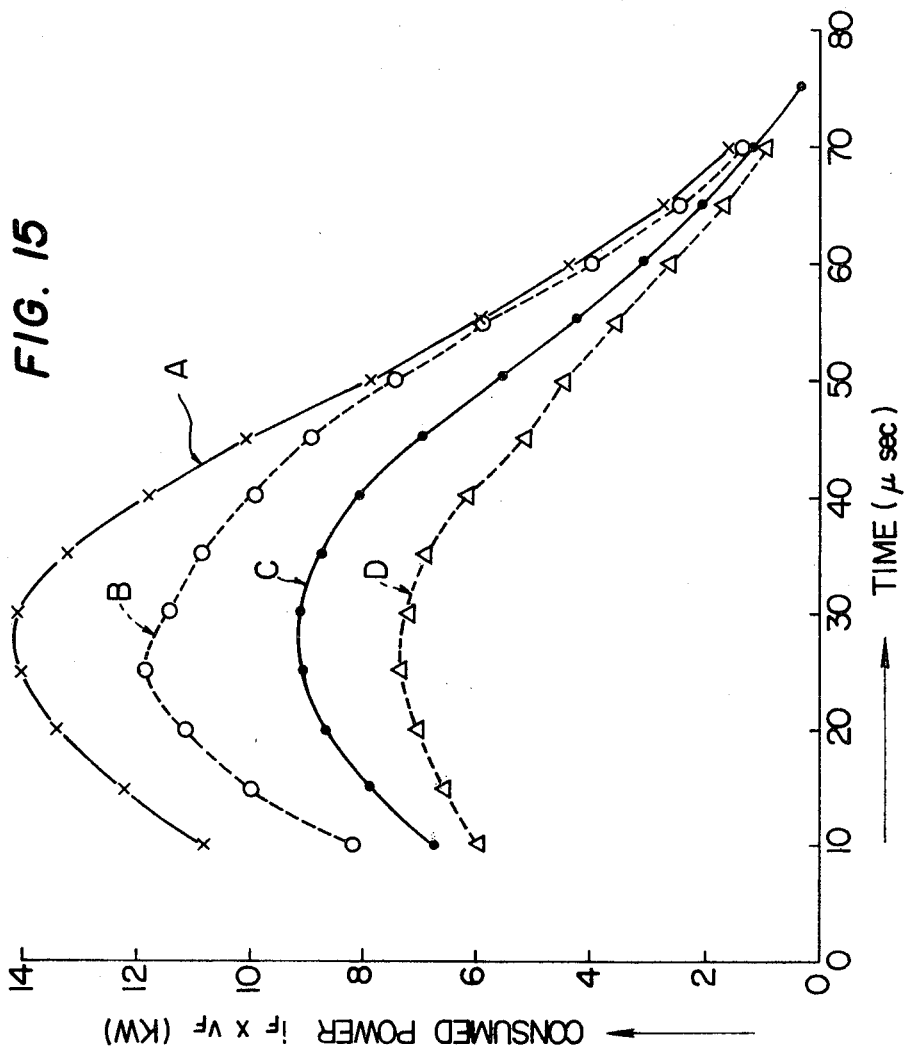

SEMICONDUCTOR CONTROLLED RECTIFIER

BACKGROUND OF THE INVENTION

1. Field of the Invention

This invention relates to a semiconductor controlled rectifier which is turned on by gate current supplied from a gate electrode.

2. Description of the Prior Art

A semiconductor controlled rectifier which is turned on by gate current comprises generally a semiconductor substrate of *pnpn* structure consisting of four continuous layers of alternately different conductivity types, a pair of main electrodes in ohmic contact with the exposed surface of the outer p-type and n-type layers respectively, and a gate electrode in contact with the exposed surface portion of one of the intermediate layers. The four-layer region between the main electrodes placed in the non-conducting state in rendered conducting and load current starts to flow in such a semiconductor controlled rectifier when gate voltage is applied across the gate electrode and the main electrode in contact with the outer layer adjacent to the intermediate layer in contact with the gate electrode for causing a flow of gate current across these two electrodes in a state in which bias voltage for reversely biasing the pn junction formed between the intermediate layers is applied across the opposite main electrodes. The semiconductor controlled rectifier is said to be turned on when the semiconductor controlled rectifier in such a non-conducting state is rendered conducting.

The turn-on mechanism of the semiconductor controlled rectifier which is turned on by the gate current supplied from the gate electrode is such that a small area of the four-layer region in the vicinity of the gate electrode is initially turned on in response to the supply of the gate current and this turned-on area is increased with the lapse of time until the entire region is turned on. Therefore, when the inrush current increase rate $di/dt$ during turning on the semiconductor controlled rectifier is considerably large, the density of load current in the limited area of the four-layer region in the vicinity of the gate electrode (the small area portion initially turned on) is excessively large and the temperature of this region is unusually increased to such an extent that the semiconductor controlled rectifier may be finally subject to thermal breakdown.

Various methods have been proposed heretofore in an effort to prevent this objectionable thermal breakdown by increasing the capability of the semiconductor controlled rectifier to withstand a large inrush current increase rate $di/dt$. For example, a proposal has been made in which the gate electrode of a semiconductor controlled rectifier is formed in an annular shape so that initial conduction can take place at the entire periphery of the four-layer region opposite to the annular gate electrode. However, this proposal is defective in that an excessively large gate current is required for turning on the semiconductor controlled rectifier.

The most desirable condition for a semiconductor controlled rectifier is that a widest possible area of the semiconductor controlled rectifier can be quickly turned on with a small gate power. A semiconductor controlled rectifier of an amplifying gate type is known as one of those which satisfy the condition above described. Such a semiconductor controlled rectifier is disclosed in, for example, U.S. Pat. No. 3,526,815 (Swedish Pat. No. 311,701) and comprises a semiconductor substrate consisting of four continuous layers of pnpn structure, the outer n-type layer of said semiconductor substrate including a main region and an auxiliary region which is isolated from the main region by a portion of the adjacent intermediate layer and has an area smaller than that of the main region, a pair of main electrodes in ohmic contact with the surface of the outer p-type layer and the surface of the main region of the n-type layer respectively, a gate electrode in contact with the portion of the intermediate layer adjacent to the auxiliary region and remote from the main region, and an auxiliary electrode connecting the surface of the auxiliary region with the intermediate layer. The turn-on mechanism of this semiconductor controlled rectifier is such that the four-layer region whose end layer is the auxiliary region, or an auxiliary thyristor is initially turned on by gate current supplied from the gate electrode and load current flowing due to the turn-on of the auxiliary thyristor is used as gate current for turning on the four-layer region whose end layer is the main region, or a main thyristor. Such a semiconductor controlled rectifier can be quickly turned on over a wide area with small gate current. However, this semiconductor controlled rectifier is not still completely satisfactory. More precisely, due to the fact that the turn-on area of the main thyristor is determined by the length of the auxiliary electrode opposite to the main region, the gate current supplied to the main thyristor, that is, the load current flowing due to the turn-on of the auxiliary thyristor must be increased with the increase in the length of the auxiliary electrode opposite to the main region, and in order to increase the load current flowing due to the turn-on of the auxiliary thyristor, the gate current supplied from the gate electrode must be increased to widen the turn-on area of the auxiliary thyristor. Thus, this prior art semiconductor controlled rectifier is defective in that the gate current must be increased in order to increase the capability to withstand a large inrush current increase rate $di/dt$ during turn-on of the rectifier although it is small compared with that required in the case of the annular gate electrode.

SUMMARY OF THE INVENTION

It is an object of the present invention to provide a semiconductor controlled rectifier of novel structure in which a wide area can be turned on with small gate current.

Another object of the present invention is to provide a semiconductor controlled rectifier of novel structure in which gate current can be effectively utilized for turning on the device.

Still another object of the present invention is to provide a semiconductor controlled rectifier of novel structure which can operate with an improved efficiency of injection of carriers from the outermost layer into the adjacent intermediate layer in spite of the fact that gate current value is the same as that used in prior art devices.

Yet another object of the present invention is to provide a semiconductor controlled rectifier of novel structure which has an increased capability (or a switching power capability) to withstand a large inrush current increase rate $di/dt$ during turn-on of the device.

Other objects, features and advantages of the present invention will be apparent from the following detailed description taken in conjunction with the accompanying drawings.

BRIEF DESCRIPTION OF THE DRAWINGS

FIG. 15 is a graph showing the results of measurement of consumed power relative to time during turn-on of a prior art semiconductor controlled rectifier and a few forms of the semiconductor controlled rectifier according to the present invention.

DESCRIPTION OF THE PREFERRED EMBODIMENTS

The semiconductor controlled rectifier according to the present invention is featured by the fact that it comprises a semiconductor substrate consisting of at least three continuous layers of alternately different conductivity types, a pair of main electrodes in ohmic contact with the outermost layers respectively of said semiconductor substrate, a gate electrode in contact with the intermediate layer of said semiconductor substrate, and means for directing gate current supplied from said gate electrode into the outermost layer adjacent to the intermediate layer which is in contact with said gate electrode and forms a pn junction between it and said outermost layer so that the gate current can flow into said outermost layer through the portion of said pn junction which is parallel with the surface of said outermost layer. Various embodiments of the present invention will now be described with reference to the accompanying drawings.

Figure 1:
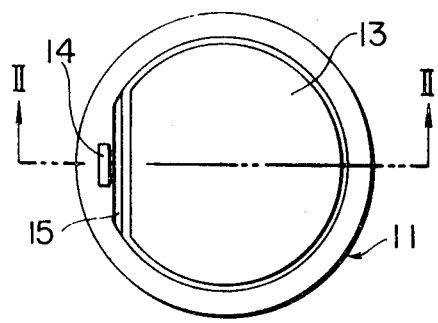
FIG. 1 is a schematic plan view of a first embodiment of the semiconductor controlled rectifier according to the present invention.
Figure 2:
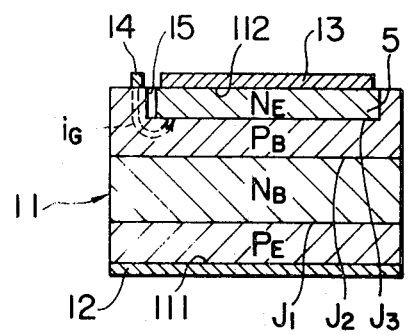
FIG. 2 is a schematic sectional view taken on the line II—II in FIG. 1.

Referring to FIGS. 1 and 2 showing a first embodiment of the semiconductor controlled rectifier according to the present invention, a semiconductor substrate 11 consists of four layers of alternately different conductivity types formed between a pair of opposite principal surfaces 111 and 112. That is, the semiconductor substrate 11 consists of a p-type emitter layer $P_E$, an n-type base layer $N_B$, a p-type base layer $P_B$ and an n-type emitter layer $N_E$ arranged in the above order. A pair of main electrodes 12 and 13 are in low ohmic contact with the layers $P_E$ and $N_E$ at the principal surfaces 111 and 112 respectively. A conductor 14 is in contact with the exposed portion of the layer $P_B$ at the principal surface 112 to serve as a gate electrode, and a groove 15 is formed between the conductor 14 and the layer $N_E$ in the vicinity of the conductor 14. Preferably, this groove 15 is formed in the layer $P_B$ to define a space between the layers $N_E$ and $P_B$ and has a depth which is approximately equal to the depth of the layer $N_E$ in the direction of lamination of the semiconductor layers.

In the semiconductor controlled rectifier having such a structure, control signal current $i_G$ (hereinafter referred to as gate current) supplied from the conductor 14 toward the main electrode 13 flows into the layer $N_E$ through the portion of the pn junction $J_3$ between the layers $N_E$ and $P_B$ which portion is parallel with the principal surface 112 due to the presence of the groove 15 between the layers $N_E$ and $P_B$. Commonly, the layers $P_E$, $N_B$, $P_B$ and $N_E$ in the semiconductor controlled rectifier shown in FIGS. 1 and 2 are formed by diffusing impurities into a semiconductor wafer of either conductivity type, or the layers $P_E$, $N_B$ and $P_B$ are formed by diffusion of impurities while the layer $N_E$ is formed by alloying an impurity metal. It is commonly known that the impurity concentration of a layer formed by diffusion is successively increased toward one of the surfaces and is highest at such surface. Thus, taking into consideration the fact that the layer $N_E$ is quite thin, the difference between the impurity concentration of the layer $P_B$ on one side of the pn junction $J_3$ and that of the layer $N_E$ on the other side of the pn junction $J_3$ is greatest at the portion of the pn junction $J_3$ which is parallel with the principal surface 112 and is successively reduced at portions nearer to the principal surface 112. Suppose that the value of current passing through the pn junction is constant. Then, the greater the impurity concentration difference, the amount of injected carriers is greater. In other words, the efficiency of carrier injection becomes higher with the increase in the impurity concentration difference. On the other hand, the carriers injected into the layer $P_B$ from the layer $N_E$ cannot contribute to the turn-on of the semiconductor controlled rectifier unless they reach the depletion layer formed in the vicinity of the pn junction $J_2$ between the layers $P_B$ and $N_B$. This means that, in order to effectively utilize the carriers injected from the layer $N_E$ for turning on the semiconductor controlled rectifier, the carriers are desirably injected through the pn junction $J_3$ which is nearest to the pn junction $J_2$.

In the semiconductor controlled rectifier shown in FIGS. 1 and 2, the carriers are injected from the layer $N_E$ into the layer $P_B$ at the portion of the pn junction $J_3$ which is parallel with the principal surface 112, which is nearest to the pn junction $J_2$ and where the difference between the impurity concentration of the layer $N_E$ and that of the layer $P_B$ is greatest. Thus, the amount of injected carriers is greater than when the groove 15 is not formed provided that the gate current value is the same, and also, the amount of carriers reaching the pn junction $J_2$ is greater than when the groove 15 is not provided. Therefore, the semiconductor controlled rectifier of the present invention can be turned on with small gate current.

Figure 3:
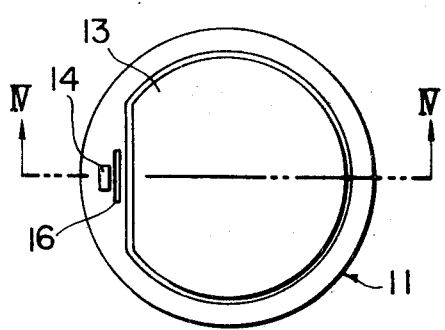
FIG. 3 is a schematic plan view of a second embodiment of the present invention.
Figure 4:
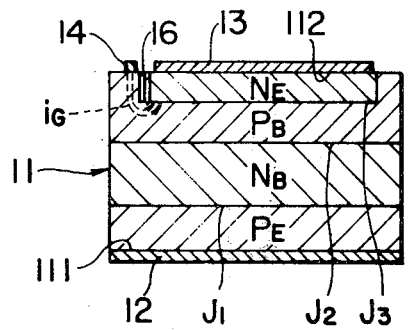
FIG. 4 is a schematic sectional view taken on the line IV—IV in FIG. 3.

FIGS. 3 and 4 show a second embodiment of the present invention and this is actually a modification of the semiconductor controlled rectifier shown in FIGS.

1 and 2. Referring to FIGS. 3 and 4, a first auxiliary region 16 of n-type which replaces the groove 15 is formed in the layer $P_B$ between the conductor 14 and the layer $N_E$ in suitably spaced apart relation from the conductor 14 and layer $N_E$ so that this region 16 can provide the same function as that of the groove 15 in FIGS. 1 and 2. Such a structure provides the advantage of reducing the gate current as in the embodiment shown in FIGS. 1 and 2. In addition, this structure is advantageous in that the auxiliary region 16 can be formed simultaneously with the layer $N_E$ by diffusion and the formation of the auxiliary region 16 is easier than the formation of the groove 15 in FIGS. 1 and 2. This structure is further advantageous in that the auxiliary region 16 can be formed to have any desired small width.

Figure 5:
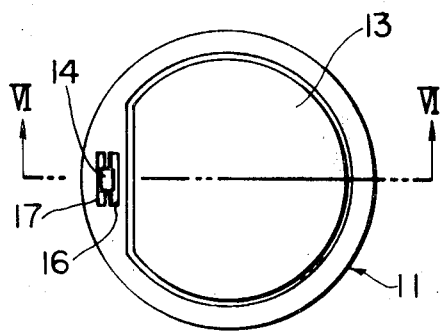
FIG. 5 is a schematic plan view of a third embodiment of the present invention.
Figure 6:
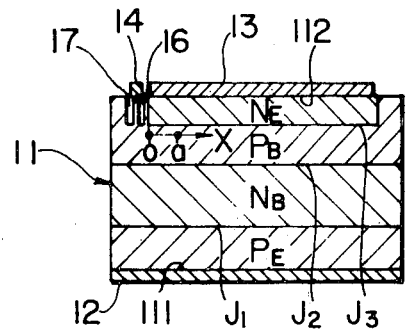
FIG. 6 is a schematic sectional view taken on the line VI—VI in FIG. 5.

FIGS. 5 and 6 show a third embodiment of the present invention which can operate with a gate current value smaller than that in the first and second embodiments. This third embodiment is actually a modification of the second embodiment shown in FIGS. 3 and 4. Referring to FIGS. 5 and 6, a second auxiliary region 17 of n-type is formed on one side of the first auxiliary region 16 remote from the layer $N_E$ and in slightly spaced relation from the first auxiliary region 16, and the conductor 14 is in contact with the surface portion of the layer $P_B$ between the first and second auxiliary regions 16 and 17.

Consider now a plane $x$ which is parallel with the principal surface 112 and lies in the layer $P_B$ in such a semiconductor controlled rectifier. Suppose that $\delta(o)$ is the resistance between the conductor 14 and the position $x = o$ on the plane $x$ illustrated, and $\delta(x)$ is the resistance (plane resistance) between the position $x = o$ to an arbitrarily selected position on the plane $x$. Then, the resistance $R(x)$ between the conductor 14 and the arbitrarily selected position on the plane $x$ is given by $R(x) = \delta(o) + \delta(x)$. The gate current distribution $i_G(x)$ on the plane $x$ is given by $$i_G(x) = \frac{V_G}{R(x)} = \frac{V_G}{\delta(o) + \delta(x)}$$

where $V_G$ is the gate voltage.
Therefore, $$\frac{di_G(x)}{dx} = \frac{-V_G}{(\delta(o) + \delta(x))^2} \cdot \frac{d\delta(x)}{dx}$$

and the rate of decrease of the gate current along the plane $x$ is reduced with the increase in the resistance $\delta(o)$ between the conductor 14 and the position $x = o$. Therefore, when the distance between the first and second auxiliary regions 16 and 17 is reduced to increase the resistance of the portion of the layer $P_B$ between the first and second auxiliary regions 16 and 17, the length of the portion ($x = a$ in FIG. 6) of the $pn$ junction $J_3$ between the layers $N_E$ and $P_B$ which portion is parallel with the principal surface 112 can be increased to increase the region turned on by the gate current $i_G$.

In this case, an effect similar to that above described can be attained by connecting the first and second auxiliary regions 16 and 17 at opposite ends thereof or by providing a groove as shown in FIGS. 1 and 2 in lieu of such auxiliary regions.

Figure 7:
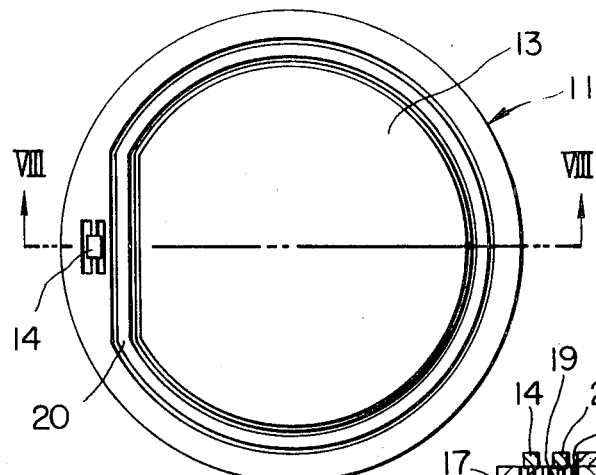
FIG. 7 is a schematic plan view of a fourth embodiment of the present invention.
Figure 8:
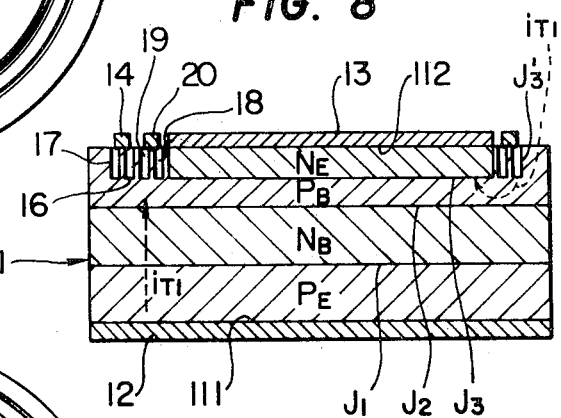
FIG. 8 is a schematic sectional view taken on the line VIII—VIII in FIG. 7.

FIGS. 7 and 8 show a fourth embodiment of the present invention in which a wider region than that in the prior art semiconductor controlled rectifier of the amplifying gate type can be initially turned on in response to the supply of gate current of the same value as that used in the third embodiment. This fourth embodiment is actually a modification of the third embodiment shown in FIGS. 5 and 6. Referring to FIGS. 7 and 8, an annular third auxiliary region 18 of n-type and an annular fourth auxiliary region 19 of n-type are formed in parallel with each other between the first auxiliary region 16 and the layer $N_E$ in substantially equally spaced apart relation and extend into the layer $P_B$ along the marginal end edge portion of the layer $N_E$. An annular conductor 20 is in contact with the surface portion of the layer $P_B$ between the third and fourth auxiliary regions 18 and 19 and with the surface portion of the fourth auxiliary region 19 nearer to the first auxiliary region 16. In this embodiment, the fourth auxiliary region 19 is initially turned on in response to the supply of gate current $i_G$ from the conductor 14. Turn-on current $i_{T1}$ appearing due to the turn-on of the fourth auxiliary region 19 passes through the fourth auxiliary region 19, the conductor 20 and the portion of the layer $P_B$ between the third and fourth auxiliary regions 18 and 19 to flow into the main electrode 13 through the portion of the pn junction $J_3$ between the layers $N_E$ and $P_B$ which portion is parallel with the principal surface 112. Thus, this current $i_{T1}$ acts as a gate current for turning on the marginal end edge portion of the layer $N_E$ opposite to the conductor 20. Such a turn-on mechanism is similar to that of the amplifying gate type. In the present invention, however, the gate current flowing from the conductor 14 to the fourth auxiliary region 19 and the turn-on current flowing from the conductor 20 to the layer $N_E$ flow into the main electrode 112 through the portions of the respective $pn$ junctions $J_3'$ and $J_3$ between the fourth auxiliary region 19 and the layer $P_B$ and between the layers $N_E$ and $P_B$ which portions are parallel with the principal surface 112. Therefore, the gate current value and turn-on current value can be reduced to less than those in the prior art amplifying gate type when the capability to withstand the inrush current increase rate $di/dt$ is the same and the same area is initially turned on. In other words, the switching power capability can be remarkably increased according to the present invention compared with the prior art amplifying gate type provided that the gate current value and turn-on current value are the same as those in the prior art semiconductor controlled rectifier. It has been experimentally ascertained that the switching power capability can be increased by about 30%.

Although the third and fourth auxiliary regions 18, 19 and conductor 20 of annular shape are provided around the periphery of the layer $N_E$ in the embodiment shown in FIGS. 7 and 8, these portions are not necessarily annular in shape since their shape is determined by the desired area which is initially turned on. Further, although the first, second, third and fourth auxiliary regions 16, 17, 18 and 19 of n-type are provided in the embodiment shown in FIGS. 7 and 8, a groove as shown in FIGS. 1 and 2 may be provided except the portion corresponding to the fourth auxiliary region 19 to attain the effect similar to that described with reference to FIGS. 1 and 2.

Furthermore, the objects of the present invention can be attained without the provision of the second auxiliary region 17 or the first and second auxiliary regions 16 and 17 in the embodiment shown in FIGS. 7 and 8. In such a case, the gate current value is slightly increased compared with the case in which the second auxiliary region 17 or the first and second auxiliary regions 16 and 17 are provided. However, the initially turned-on region of the layer $N_E$ can be increased by the action of the third and fourth auxiliary regions 18 and 19 compared with the prior art amplifying gate type provided that the gate current value is the same as that in the prior art semiconductor controlled rectifier.

Figure 9:
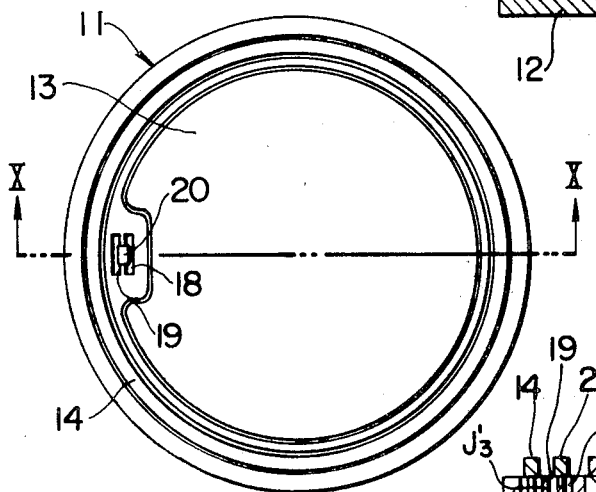
FIG. 9 is a schematic plan view of a fifth embodiment of the present invention.
Figure 10:
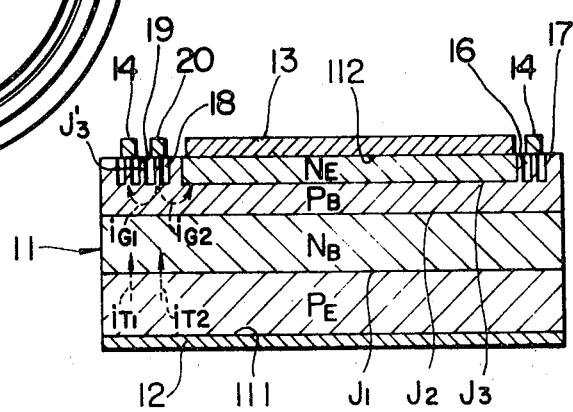
FIG. 10 is a schematic sectional view taken on the line X—X in FIG. 9.

FIGS. 9 and 10 show a fifth embodiment of the present invention in which the initially turned-on region can be widened in spite of a small gate current value as in the embodiment shown in FIGS. 7 and 8. In the semiconductor controlled rectifier shown in FIGS. 9 and 10, which is actually a modification of the embodiment shown in FIGS. 7 and 8, the region turned on by gate current can be widened and the switching power capability can be increased. Referring to FIGS. 9 and 10, the relation between the conductors 14 and 20 is reversed from that in FIGS. 7 and 8 so that a portion $i_{G2}$ of gate current $i_G$ can flow into the portion of the layer $N_E$ opposite to the conductor 20 thereby widening the region turned on by the gate current. In this embodiment, the conductor 20 is disposed relatively close to the conductor 14 so that the density $j_{G1}$ of the gate current portion $i_{G1}$ flowing into the conductor 14 is greater than the density $j_{G2}$ of the gate current portion $i_{G2}$ flowing into the layer $N_E$. Therefore, turn-on current $i_{T1}$ starts to flow initially in the portion directly beneath the conductor 14 in response to the supply of the gate current portion $i_{G1}$, and then turn-on current $i_{T2}$ flows in response to the supply of the gate current portion $i_{G2}$. According to this embodiment, the gate current portions $i_{G1}$ and $i_{G2}$ can turn on a wide region even when the rate of rise of load current ($di_T/dt$) in the initial stage of turn-on process is relatively small to such an extent that the portion adjacent to the main electrode 13 cannot be turned on by the turn-on current portion $i_{T1}$ flowing into the main electrode 13 through the conductor 14. It has not been possible with the prior art semiconductor controlled rectifier of the amplifying gate type to initially turn on a wide region unless the $di_T/dt$ in the initial period of turn-on process is considerably layer.

Further, in the prior art semiconductor controlled rectifiers of the amplifying gate type, the region initially turned on in the peripheral portion of the layer $N_E$ opposite to the conductor differs depending on the individual rectifiers, and the rate of spread of the turn-on region varies also depending on the individual rectifiers when the $di_T/dt$ in the initial period of turn-on process is small. Therefore, a system comprising parallel connection of a plurality of such prior art semiconductor controlled rectifiers of the amplifying gate type has been defective in that turn-on current values of the individual rectifiers fluctuate within a wide range resulting in an unbalance of the turn-on current distribution in the individual rectifiers when the $di_T/dt$ in the initial period of turn-on process is small and no amplification effect is expected. Such a defect is obviated by the present invention because, even when the $di_T/dt$ in the initial period of turn-on process is small and no amplification effect is expected, a predetermined region in the peripheral portion of the layer $N_E$ opposite to the conductor 20 can be reliably turned on by the gate current portion $i_{G2}$ as described above.

Further, the above-mentioned embodiment has the following advantages over the prior art semiconductor controlled rectifier of the amplifying gate type. In the prior art semiconductor controlled rectifier of the amplifying gate type, when the latching current flows from the second gate electrode to the cathode, a voltage drop occurs between these electrodes. On the other hand, in this embodiment such a voltage drop does not occur, since the periphery of the layer $N_E$ opposite to the conductor 14 is immediately turned on by a small gate current. Thus, in this embodiment the finger voltage, that is, the minimum forward applied voltage required to turn on the rectifier, is less than that of the prior art semiconductor controlled rectifier of the amplifying gate type. When two semiconductor controlled rectifiers having different finger voltages are connected in parallel, the rectifier having the smaller finger voltage is turned on first. The other rectifier is not turned on until the forward applied voltage across it reaches its finger voltage, due to the increase of the forward current through the rectifier which has been turned on. Thus, the unbalance of the forward currents through two rectifiers of this embodiment connected directly in parallel is smaller than that of the prior semiconductor controlled rectifier of the amplifying gate type.

In this embodiment too, suitable modifications may be made in the first, second, third and fourth auxiliary regions 16, 17, 18 and 19 and conductor 14 as described with regard to the fourth embodiment.

Figure 11:
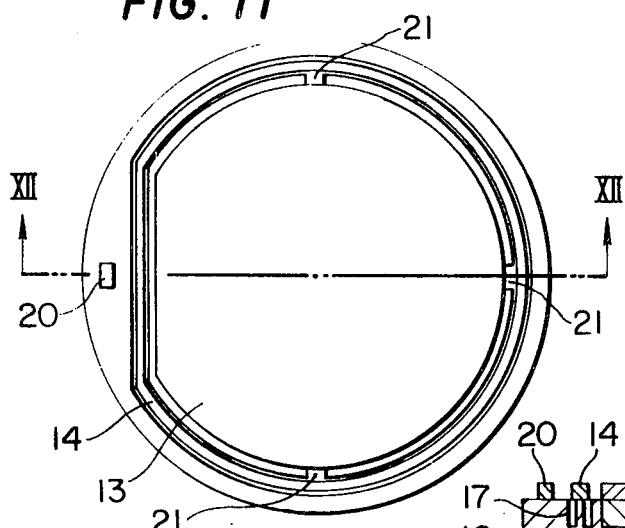
FIG. 11 is a schematic plan view of a sixth embodiment of the present invention.
Figure 12:
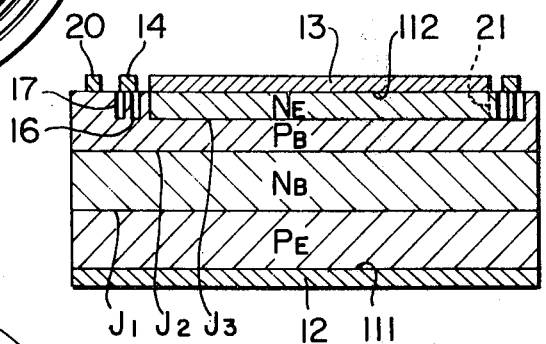
FIG. 12 is a schematic sectional view taken on the line XII—XII in FIG. 11.

FIGS. 11 and 12 show a sixth embodiment of the present invention which attains, in addition to the various objects of the present invention, a novel effect of preventing the semiconductor controlled rectifier from being undesirably turned on due to a large temperature rise or when the rate of rise of the forward applied voltage across the device $dV/dt$ is considerably large. This embodiment is actually a modification of the third embodiment shown in FIGS. 5 and 6 and differs from the latter in that the first and second auxiliary regions 16 and 17 are formed so as to surround the layer $N_E$, a conductor 20 is formed in the vicinity of the conductor 14 on the surface of the layer $P_B$ and a plurality of small regions 21 of n-type are provided to locally connect the layer $N_E$ to the first auxiliary region 16 which is nearer to the layer $N_E$ than the second auxiliary region 17.

In the semiconductor controlled rectifier having such a structure, displacement current which flows into the peripheral portion of the layer $N_E$ by applying the forward voltage across the device or leakage current due to temperature rise is divided into a portion which flows directly into the layer $N_E$ and another portion which flows from the first and second auxiliary regions 16 and 17 into the layer $N_E$ through the small regions 21. Thus, the current density at the portions where these current portions flow into the layer $N_E$ can be reduced to prevent undesirable mal-functional turn-on of the semiconductor controlled rectifier. The electric resistance of the small regions 21 in the direction of from the first auxiliary region 16 to the layer $N_E$ is desirably selected to be a lowest limit which will not obstruct the turn-on of the semiconductor controlled rectifier by the turn-on current. An effect similar to that above described can be attained by replacing these small regions 21 by suitable external resistors.

In the semiconductor controlled rectifier shown in FIGS. 11 and 12, the conductor 20 is merely disposed on the layer $P_B$, but it is apparent that arrangements as shown in FIGS. 1, 2, 3 and 4 may be employed as desired. Further, the small regions 21 employed in this sixth embodiment may also be employed in the fifth embodiment shown in FIGS. 9 and 10.

When such small regions as those 21 in the sixth embodiment are employed in FIGS. 7–12, it is necessary to provide a high capability to withstand a large rate of a forward applied voltage $dV/dt$ that: the conductor 20 (FIGS. 7–8) or 14 (FIGS. 11–12) has to be extended, crossing over the fourth region 19 (FIGS. 7–8) or 17 (FIGS. 11–12), to be in contact with a portion of the surface of the layer $P_B$, which portion is far from the conductor 14 (FIGS. 7–8) or 20 (FIGS. 11–12); the conductor 14 has to be extended to cover the whole of the fourth region 17 and to be in contact with portions the surface of the layer $P_B$ in FIGS. 9 and 10.

Figure 13:
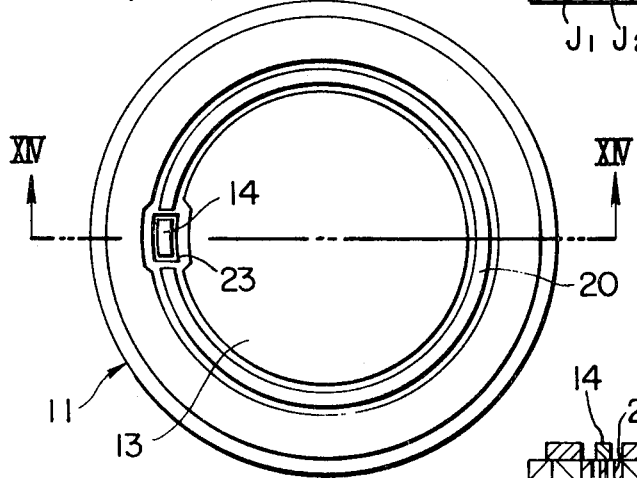
FIG. 13 is a schematic plan view of a seventh embodiment of the present invention.
Figure 14:
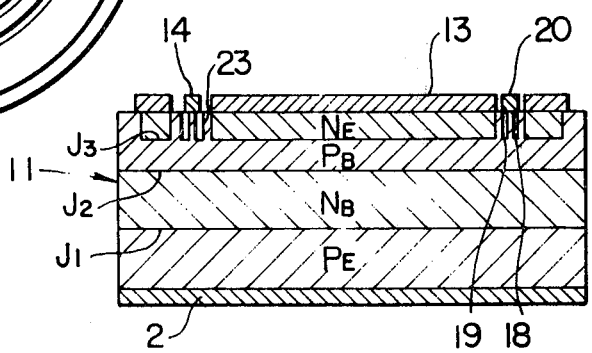
FIG. 14 is a schematic sectional view taken on the line XIV—XIV in FIG. 13.

FIGS. 13 and 14 show a seventh embodiment of the present invention. Referring to FIGS. 13 and 14, the seventh embodiment differs somewhat from the preceding embodiments in that the n-type layer $N_E$ is divided into a central circular portion and an annular portion surrounding the central circular portion, the third and fourth auxiliary regions 18 and 19 of n-type are of open-ended annular shape having their open ends facing each other and are disposed in the p-type layer $P_B$ in substantially equally spaced relation between the central circular portion and annular portion of the n-type layer $N_E$, the conductor 20 is also of open-ended annular shape and is disposed on the portion of the surface of the layer $P_B$ between the third and fourth auxiliary regions 18 and 19 to contact the surface of these auxiliary regions 18 and 19, and the conductor 14 is of arcuate shape and is disposed on the portion of the surface of the layer $P_B$ between the open ends of the conductor 20. The turn-on mechanism of this semiconductor controlled rectifier is such that the third and fourth auxiliary regions 18 and 19 are initially turned on by gate current supplied from the conductor 14 to these auxiliary regions 18 and 19, and then the central circular portion and annular portion of the layer $N_E$ are turned on in a manner similar to that described with reference to the preceding embodiments. In this embodiment, the gate current supplied from the conductor 14 flows into the third and fourth auxiliary regions 18 and 19 rather than flowing into the layer $N_E$. Further, in this embodiment, small auxiliary regions 23 of arcuate shape may be formed beneath the conductor 14. The semiconductor controlled rectifier having such a structure is advantageous in that the capability to withstand the $di_T/dt$ in the initial period of turn-on process can be increased to more than those of the fifth and sixth embodiments.

In order to provide a higher switching power capability in the embodiments shown in FIGS. 7–14, the fourth or the third region to be turned on by a gate current from the corresponding conductor is made to have a further extended area. Practically, for example, the portion of the fourth or third region opposing the conductor is made larger in area than the other portion of the region or the fourth and third regions are joined with each other.

FIG. 15 shows the results of measurement of power loss when current of sinusoidal waveform having a peak value of 2000 A and a pulse width of 80 μsec is supplied to a prior art semiconductor controlled rectifier of the amplifying gate type and a few forms of the semiconductor controlled rectifier according to the present invention. Load current starts to flow at time $t$ = $o$. The curve A represents power consumed by the prior art amplifying gate type semiconductor controlled rectifier, the curve B power consumed by the sixth embodiment of the present invention, the curve C power consumed by the seventh embodiment of the present invention, and the curve D power consumed by the combination of the sixth and seventh embodiments of the present invention (that is, the combination in which the conductor 20 in the sixth embodiment is electrically connected to the conductor 20 in the seventh embodiment). The length of the conductor opposite to the layer $N_E$ is 16.4 mm in the case of the curve A, 12.4 mm in the case of the curve B, 26.2 mm in the case of the curve C, and 38.6 mm in the case of the curve D. It will be apparent from the results of measurement that the temperature rise in the region turned on by the gate current can be remarkably reduced according to the present invention. Therefore, the semiconductor controlled rectifier of the present invention has a large $di/dt$ capability compared with the prior art semiconductor controlled rectifier.

It will be understood from the foregoing description that, in the semiconductor controlled rectifier according to the present invention, gate current can be supplied from the conductor (gate electrode) disposed on the p-type base layer $P_B$ into a wide region of the pn junction $J_3$ (or more precisely the portion of the pn junction $J_3$ parallel with the principal surface) formed between the n-type emitter layer $N_E$ and the p-type base layer $P_B$ nearest to the n-type base layer $N_B$. Thus, electrons can be effectively injected from the n-type emitter layer $N_E$ into a wide region of the n-type base layer $N_B$ for initially turning on a wide area.

In an *npn* or *pnp* transistor, it is required for the purpose of increasing the current amplification to cause flow of base current into a wide region of the pn junction formed between the emitter layer and the base layer so that carriers can be effectively injected from the emitter layer into the collector layer. The base electrode and collector layer of such transistor correspond respectively to the gate electrode disposed on the p-type base layer $P_B$ and the n-type base layer $N_B$ of the thyristor. Therefore, the present invention, which attains effective injection of electrons into a wide region of the n-type base layer $N_B$ from the n-type emitter layer $N_E$, can be employed as an effective means for improving the current amplification of the transistor of the type above described.

What is claimed is:
1. A semiconductor controlled rectifier comprising:
a semiconductor substrate with first and second principal surfaces opposite each other, said semiconductor substrate including four continuous layers of alternately different conductivity types between said first and second principal surfaces so that *pn* junctions are formed between each two adjacent layers, the entire end of the *pn* junction formed between a first outermost layer and a first intermediate layer adjacent to said first outermost layer being exposed at said first principal surface, said first outermost layer and part of said first intermediate layer constituting said first principal surface, first and second auxiliary regions being formed in said first intermediate layer to the depth of said first outermost layer and having a conductivity type opposite that of said first intermediate layer, said first and second auxiliary regions being spaced apart from and facing each other and extending along the marginal edge of said first outermost layer and spaced apart from said first outermost layer and exposed at said first principal surface, said first outermost layer being closer to said first auxiliary region than to said second auxiliary region, third and fourth auxiliary regions being formed between said first outermost layer and said first auxiliary region in said first intermediate layer to the depth of said first outermost layer and having a conductivity type opposite that of said first intermediate layer, said third and fourth auxiliary regions being spaced apart from and facing each other and extending along the marginal edge of said first outermost layer and spaced apart from said first outermost layer and exposed at said first principal surface, said first outermost layer being closer to said third auxiliary region than to said fourth auxiliary region, and a second outermost layer constituting said second principal surface;

a first main electrode in ohmic contact with said first outermost layer on said first principal surface;

a second main electrode in ohmic contact with said second outermost layer on said second principal surface;

a conductor in electrical contact with said first auxiliary region, said second auxiliary region and that portion of said first intermediate layer which lies between said first and second auxiliary regions on said first principal surface; and an auxiliary electrode in electrical contact with said third auxiliary region, said fourth auxiliary region and that portion of said first intermediate layer which lies between said third and fourth auxiliary regions on said first principal surface.

2. A semiconductor controlled rectifier as claimed in claim 1, wherein the lengths of said third and fourth auxiliary regions along the periphery of said first outermost layer are larger than those of said first and second auxiliary regions.

3. A semiconductor controlled rectifier as claimed in claim 1, wherein the lengths of said first and second auxiliary regions along the periphery of said first outermost layer are larger than those of said third and fourth auxiliary regions.

4. A semiconductor controlled rectifier as claimed in claim 3, wherein said third and fourth auxiliary regions are connected to each other at adjacent and spaced apart surface portions thereof.

5. A semiconductor controlled rectifier as claimed in claim 2, wherein said third and fourth auxiliary regions surround said first outermost layer along the marginal edge of said first outermost layer.

6. A semiconductor controlled rectifier as claimed in claim 3, wherein said first and second auxiliary regions surround said first outermost layer along the marginal edge of said first outermost layer.

7. A semiconductor controlled rectifier as claimed in claim 6, wherein said third and fourth auxiliary regions are connected to each other at adjacent and spaced apart surface portions thereof.

8. A semiconductor controlled rectifier comprising:

a semiconductor substrate with first and second principal surface opposite each other, said semiconductor substrate including four continuous layers of alternately different conductivity types between said first and second principal surfaces so that pn junctions are formed between each two adjacent layers, a first outermost layer being constituted by a central section and a peripheral section surrounding said central section, the entire ends of pn junctions formed between said first outermost layer and a first intermediate layer adjacent said first outermost layer being exposed at said first principal surface, said central and peripheral sections of said first outermost layer being spaced apart from each other in said first intermediate layer, said first outermost layer and part of said first intermediate layer constituting said first principal surface, first and second auxiliary regions being formed between said central and peripheral sections of said first outermost layer in said first intermediate layer to the depth of said first outermost layer and having a conductivity type opposite to that of said first intermediate layer, said first and second auxiliary regions being spaced apart from and facing each other and extending annularly and continuously to partially surround said central section of said first outermost layer and spaced apart from said central section of said first outermost layer and exposed at said first principal surface, said first and second auxiliary regions being connected to each other at adjacent and spaced apart surface portions, a third annular auxiliary region being formed to the depth of said first outermost layer in a space in said first intermediate layer defined between said central and peripheral sections of said first outermost layer and the ends of said first and second auxiliary regions, said third auxiliary region being spaced apart from said first outermost layer and said first and second auxiliary region and having a conductivity type opposite to that of said first intermediate layer and exposed at said first principal surface, and a second outermost layer constituting said second principal surface;

a first main electrode in ohmic contact with said first outermost layer on said first principal surface;

a second main electrode in ohmic contact with said second outermost layer on said second principal surface;

a conductor in electrical contact with said first auxiliary region, said second auxiliary region and that portion of said first intermediate layer which lies between said first and second auxiliary regions on said first principal surface; and an auxiliary electrode in electrical contact with said third auxiliary region and that portion of said first intermediate layer which is defined by said third auxiliary region on said first principal surface.

* * * * *